US012621933B2

(12) United States Patent
Kuo et al.

(10) Patent No.: US 12,621,933 B2
(45) Date of Patent: May 5, 2026

(54) CAPACITIVE ELEMENT, CIRCUIT CARRIER HAVING THE SAME AND FABRICATION METHOD THEREOF

(71) Applicant: UNIMICRON TECHNOLOGY CORP., Taoyuan City (TW)

(72) Inventors: Chun Hung Kuo, Taoyuan City (TW); Kuo-Ching Chen, Taoyuan City (TW); Yu-Cheng Huang, Taoyuan City (TW); Yu-Hua Chen, Taoyuan City (TW)

(73) Assignee: UNIMICRON TECHNOLOGY CORP., Taoyuan City (TW)

( * ) Notice: Subject to any disclaimer, the term of this patent is extended or adjusted under 35 U.S.C. 154(b) by 227 days.

(21) Appl. No.: 18/236,280

(22) Filed: Aug. 21, 2023

(65) Prior Publication Data

US 2025/0040051 A1    Jan. 30, 2025

(30) Foreign Application Priority Data

Jul. 26, 2023    (TW) ................................. 112127897

(51) Int. Cl.
*H05K 1/16*        (2006.01)
*H01G 4/012*      (2006.01)
(Continued)

(52) U.S. Cl.
CPC ............. *H05K 1/162* (2013.01); *H01G 4/012* (2013.01); *H01G 4/30* (2013.01); *H05K 1/0298* (2013.01);
(Continued)

(58) Field of Classification Search
CPC ........... H01G 4/012; H01G 4/30; H01G 4/33; H05K 1/162; H05K 1/0298; H05K 3/4673; H05K 3/4682; H05K 2201/096
See application file for complete search history.

(56) References Cited

U.S. PATENT DOCUMENTS 5,400,192 A * 3/1995 Mizoshita .......... G11B 5/00804
5,455,547 A * 10/1995 Lin .......................... H03H 9/46
                                                                    333/186

(Continued)

FOREIGN PATENT DOCUMENTS

CN        101534610 A    9/2009
CN        113133202 A    7/2021
(Continued)

OTHER PUBLICATIONS

Original and Translation of CN1825103 (Year: 2006).*
(Continued)

*Primary Examiner* — Timothy J. Dole
*Assistant Examiner* — Muhammed Azam
(74) *Attorney, Agent, or Firm* — Maschoff Brennan

(57)                ABSTRACT
A circuit carrier includes at least one wiring layer and a capacitive element. The capacitive element is disposed in at least one dielectric layer of the wiring layer. The capacitive element includes a lower electrode, an inter-electrode and an upper electrode. The inter-electrode is located between the lower electrode and the upper electrode. The inter-electrode includes a plate, at least one first finger and at least one second finger. The first finger and the second finger extend from opposite sides of the plate, respectively.

17 Claims, 8 Drawing Sheets

(51) Int. Cl.
    *H01G 4/30*          (2006.01)
    *H05K 1/02*          (2006.01)
    *H05K 3/46*          (2006.01)
(52) U.S. Cl.
    CPC ......... *H05K 3/4673* (2013.01); *H05K 3/4682*
         (2013.01); *H05K 2201/096* (2013.01)

(56)                References Cited

U.S. PATENT DOCUMENTS

| | | | | | |
|---|---|---|---|---|---|
| 5,831,492 | A | * | 11/1998 | Solie | H03H 9/14547 |
| | | | | | 333/195 |
| 5,892,153 | A | * | 4/1999 | Weinberg | G01C 19/5719 |
| | | | | | 73/504.16 |
| 5,911,156 | A | * | 6/1999 | Ward | G01C 19/5719 |
| | | | | | 73/504.16 |
| 5,945,599 | A | * | 8/1999 | Fujiyoshi | G01C 19/5719 |
| | | | | | 73/504.12 |
| 6,215,318 | B1 | * | 4/2001 | Schoefthaler | G01R 33/0286 |
| | | | | | 324/658 |
| 6,252,761 | B1 | * | 6/2001 | Branchevsky | H05K 1/162 |
| | | | | | 361/306.3 |
| 6,395,118 | B1 | * | 5/2002 | Sakamoto | C04B 35/111 |
| | | | | | 156/289 |
| 6,470,545 | B1 | * | 10/2002 | Branchevsky | H01L 23/49822 |
| | | | | | 361/309 |
| 6,486,752 | B1 | * | 11/2002 | Noguchi | H03H 9/6483 |
| | | | | | 333/195 |
| 6,565,730 | B2 | * | 5/2003 | Chakravorty | H05K 1/162 |
| | | | | | 205/118 |
| 6,603,668 | B2 | * | 8/2003 | Iwanami | H05K 1/0233 |
| | | | | | 361/795 |
| 6,647,782 | B2 | * | 11/2003 | Toyoda | G01N 27/225 |
| | | | | | 257/253 |
| 6,657,442 | B1 | * | 12/2003 | Seppa | G01R 19/22 |
| | | | | | 324/661 |
| 6,816,356 | B2 | * | 11/2004 | Devoe | H01G 4/38 |
| | | | | | 361/309 |
| 6,903,917 | B2 | | 6/2005 | Higashi et al. | |
| 6,959,583 | B2 | * | 11/2005 | Platt | G01C 19/5719 |
| | | | | | 73/1.37 |
| 7,126,809 | B2 | * | 10/2006 | Iioka | H01L 23/5223 |
| | | | | | 257/532 |
| 7,202,548 | B2 | * | 4/2007 | Lee | H01L 23/5223 |
| | | | | | 257/532 |
| 7,239,013 | B2 | * | 7/2007 | Shimada | H05K 1/162 |
| | | | | | 257/664 |
| 7,244,983 | B2 | * | 7/2007 | Kim | B82Y 10/00 |
| | | | | | 977/734 |
| 7,258,010 | B2 | * | 8/2007 | Horning | H02N 1/008 |
| | | | | | 73/514.32 |
| 7,456,463 | B2 | * | 11/2008 | Thompson | H01L 23/5223 |
| | | | | | 257/296 |
| 7,573,721 | B2 | * | 8/2009 | Lin | H05K 1/162 |
| | | | | | 361/306.1 |
| 7,670,921 | B2 | * | 3/2010 | Chinthakindi | H10D 1/716 |
| | | | | | 438/398 |
| 7,701,420 | B2 | * | 4/2010 | Tanaka | G09G 3/3233 |
| | | | | | 345/205 |
| 7,719,162 | B2 | * | 5/2010 | Min | H02N 1/008 |
| | | | | | 318/116 |
| 7,723,206 | B2 | * | 5/2010 | Miyachi | H10F 77/206 |
| | | | | | 257/E31.115 |
| 7,733,662 | B2 | * | 6/2010 | Chen | H05K 1/167 |
| | | | | | 361/298.2 |
| 7,755,910 | B2 | * | 7/2010 | Mashino | H05K 1/162 |
| | | | | | 174/253 |
| 7,838,919 | B2 | * | 11/2010 | Okamoto | H01G 4/005 |
| | | | | | 257/307 |
| 7,875,808 | B2 | * | 1/2011 | Chang | H10W 72/00 |
| | | | | | 174/260 |
| 7,893,359 | B2 | * | 2/2011 | Wu | H05K 1/162 |
| | | | | | 361/794 |

| | | | | | |
|---|---|---|---|---|---|
| 7,903,313 | B2 | * | 3/2011 | Mizuno | G02B 26/0841 |
| | | | | | 359/221.2 |
| 7,958,626 | B1 | * | 6/2011 | Karim | H01L 23/49827 |
| | | | | | 29/830 |
| 8,062,539 | B2 | * | 11/2011 | Nakamura | H05K 1/162 |
| | | | | | 29/25.42 |
| 8,102,023 | B2 | * | 1/2012 | Tanioku | H01L 21/02266 |
| | | | | | 257/532 |
| 8,205,329 | B2 | * | 6/2012 | Nakamura | H05K 1/162 |
| | | | | | 29/25.42 |
| 9,127,995 | B2 | * | 9/2015 | Scheibner | G01L 1/086 |
| 9,312,078 | B2 | * | 4/2016 | Ajayan | B01D 67/0093 |
| 9,406,442 | B2 | * | 8/2016 | Manohara | H01G 4/1209 |
| 9,730,325 | B2 | * | 8/2017 | Sekine | H01L 23/481 |
| 10,013,126 | B2 | * | 7/2018 | Hou | G06F 3/0448 |
| 10,126,165 | B2 | * | 11/2018 | Dardona | G01J 1/02 |
| 10,433,426 | B2 | * | 10/2019 | Liao | H05K 3/107 |
| 10,446,325 | B2 | * | 10/2019 | Lu | H01G 4/385 |
| 10,516,410 | B2 | * | 12/2019 | Hiraide | H01L 23/5223 |
| 10,546,915 | B2 | * | 1/2020 | Reznicek | H10B 12/30 |
| 10,837,796 | B2 | * | 11/2020 | Painter | G01C 19/5712 |
| 11,145,711 | B2 | * | 10/2021 | Ashimine | H01L 21/02164 |
| 11,152,458 | B2 | * | 10/2021 | Chen | H01L 23/5222 |
| 11,344,221 | B2 | * | 5/2022 | Gliner | H01F 17/0013 |
| 11,398,426 | B2 | * | 7/2022 | Datta | H10D 1/714 |
| 11,476,056 | B2 | * | 10/2022 | Nakagawa | H01G 4/018 |
| 11,521,799 | B2 | * | 12/2022 | Chikuma | H01G 4/012 |
| 11,540,393 | B2 | * | 12/2022 | Ito | H05K 3/4617 |
| 11,557,436 | B2 | * | 1/2023 | Fukutomi | H01G 4/232 |
| 11,562,998 | B2 | | 1/2023 | Lin et al. | |
| 11,641,713 | B2 | * | 5/2023 | Kuo | H05K 3/465 |
| | | | | | 174/257 |
| 12,033,806 | B2 | * | 7/2024 | Jo | H01G 4/35 |
| 12,184,264 | B2 | * | 12/2024 | Ylilammi | H03H 9/17 |
| 12,217,913 | B2 | * | 2/2025 | Fukae | H01G 4/008 |
| 12,288,648 | B2 | * | 4/2025 | Jo | H01G 4/35 |
| 2006/0180342 | A1 | * | 8/2006 | Takaya | H05K 1/165 |
| | | | | | 29/830 |
| 2009/0273882 | A1 | * | 11/2009 | Park | H10D 1/694 |
| | | | | | 361/305 |
| 2010/0309608 | A1 | * | 12/2010 | Chang | H01G 4/01 |
| | | | | | 361/526 |
| 2013/0146333 | A1 | * | 6/2013 | Cheng | H05K 1/0213 |
| | | | | | 174/250 |
| 2017/0155373 | A1 | * | 6/2017 | Ruby | H03H 9/02574 |
| 2017/0373009 | A1 | | 12/2017 | Yoshida et al. | |
| 2018/0235086 | A1 | | 8/2018 | Tomikawa et al. | |
| 2022/0336155 | A1 | * | 10/2022 | Kagawa | H01G 4/306 |
| 2022/0367430 | A1 | * | 11/2022 | Lee | H01L 23/49838 |
| 2023/0010901 | A1 | | 1/2023 | Adachi et al. | |
| 2023/0011666 | A1 | * | 1/2023 | Liang | H01L 23/50 |
| 2023/0037867 | A1 | | 2/2023 | Yang et al. | |
| 2023/0102582 | A1 | * | 3/2023 | Fukae | H01L 24/06 |
| | | | | | 257/301 |
| 2023/0240009 | A1 | * | 7/2023 | Takada | H05K 1/09 |
| 2024/0172358 | A1 | * | 5/2024 | Ji | H05K 3/4682 |
| 2024/0395458 | A1 | * | 11/2024 | Obata | H01G 4/385 |
| 2025/0030398 | A1 | * | 1/2025 | Yamamori | H03H 9/1085 |
| 2025/0040051 | A1 | * | 1/2025 | Kuo | H01G 4/30 |

FOREIGN PATENT DOCUMENTS

| | | | |
|---|---|---|---|
| CN | 114695132 | A | 7/2022 |
| CN | 115394746 | A | 11/2022 |
| CN | 115472742 | A | 12/2022 |
| CN | 115915916 | A | 4/2023 |
| JP | 2006-261455 | A | 9/2006 |

OTHER PUBLICATIONS

Original and Translation of JP2005072125 (Year: 2005).*
Original and Translation of TW201023219 (Year: 2010).*
Original and Translation of EP1595268 (Year: 2006).*

* cited by examiner

CAPACITIVE ELEMENT, CIRCUIT CARRIER HAVING THE SAME AND FABRICATION METHOD THEREOF

This application claims priority under 35 U.S.C. § 119 (a) on Patent Application No(s). 112127897 filed in Taiwan, R.O.C. on Jul. 26, 2023, the entire contents of which are hereby incorporated by reference.

BACKGROUND

1. Technical Field

The present disclosure relates to circuit carrier, more particularly to a circuit carrier including capacitive element.

2. Related Art

As the demand of electronic products are trending towards multi-functionality, high signal transmission speed and high component density, the functionality of an integrated circuit chip is enhancing, and the number of passive components for a consumer electronic product is also increasing dramatically. A buried capacitive element is one of the essential components in circuit board design. With the development of high-density circuit board, the lack of a buried capacitive element with high capacitance in a limited space is a problem to be solved in this technical field.

SUMMARY

According to one embodiment of the present disclosure, a circuit carrier includes at least one wiring layer and a capacitive element. The capacitive element is disposed in at least one dielectric layer of the wiring layer. The capacitive element includes a lower electrode, an inter-electrode and an upper electrode. The inter-electrode is located between the lower electrode and the upper electrode. The inter-electrode includes a plate, at least one first finger and at least one second finger. The first finger and the second finger extend from opposite sides of the plate, respectively.

According to one embodiment of the present disclosure, the lower electrode includes a plate and at least one finger. The finger of the lower electrode extends from the plate of the lower electrode toward the plate of the inter-electrode. The finger of the lower electrode is parallel with the first finger of the inter-electrode.

According to one embodiment of the present disclosure, the finger of the lower electrode overlaps the first finger of the inter-electrode in a length direction of the circuit carrier.

According to one embodiment of the present disclosure, the upper electrode includes a plate and at least one finger. The finger of the upper electrode extends from the plate of the upper electrode toward the plate of the inter-electrode. The finger of the upper electrode is parallel with the second finger of the inter-electrode.

According to one embodiment of the present disclosure, the finger of the upper electrode overlaps the second finger of the inter-electrode in a length direction of the circuit carrier.

According to one embodiment of the present disclosure, the first finger and the second finger of the inter-electrode are disposed symmetrically with respect to the plate of the inter-electrode.

According to one embodiment of the present disclosure, the first finger of the inter-electrode completely overlaps the second finger of the inter-electrode in a thickness direction of the circuit carrier.

According to one embodiment of the present disclosure, the capacitive element further includes a first interlayer dielectric and a second interlayer dielectric. The first interlayer dielectric is located between the lower electrode and the inter-electrode. The second interlayer dielectric is located between the inter-electrode and the upper electrode. The first interlayer dielectric and the second interlayer dielectric are made of different material from the dielectric layer.

According to one embodiment of the present disclosure, each of the lower electrode, the inter-electrode and the upper electrode is a comb electrode.

According to one embodiment of the present disclosure, a capacitive element for circuit carrier includes a lower electrode, an inter-electrode and an upper electrode. The inter-electrode is located between the lower electrode and the upper electrode. The inter-electrode includes a plate, at least one first finger and at least second finger. The first finger and the second finger extend from opposite sides of the plate, respectively. The first finger and the second finger are disposed symmetrically with respect to the plate of the inter-electrode.

According to one embodiment of the present disclosure, a fabrication method of a capacitive element for a circuit carrier includes the following steps: forming a lower electrode and a first interlayer dielectric on a core, wherein the lower electrode is located below the first interlayer dielectric; forming a first dielectric layer on the core, wherein the first dielectric layer exposes the first interlayer dielectric; forming an inter-electrode on the first interlayer dielectric, wherein the inter-electrode comprises a plate, at least one first finger and at least one second finger, the at least one first finger and the at least one second finger extend from opposite sides of the plate, respectively; forming a second interlayer dielectric on the inter-electrode; forming a second dielectric layer on the first dielectric layer, wherein the second dielectric layer exposes the second interlayer dielectric; and forming an upper electrode on the second interlayer dielectric.

According to one embodiment of the present disclosure, the step of forming the lower electrode and the first interlayer dielectric on the core includes: forming a metal layer on the core; forming the first interlayer dielectric on the metal layer; and removing part of the metal layer to form the lower electrode.

According to one embodiment of the present disclosure, the step of forming the metal layer on the core includes: processing the metal layer by lithography and plating.

According to one embodiment of the present disclosure, the metal layer is formed on a wiring area and a capacitor area of the circuit carrier, and the forming the first interlayer dielectric on the metal layer comprises: forming a dielectric material layer on the metal layer, wherein the dielectric material layer is spread over the wiring area and the capacitor area; completely removing the dielectric material layer in the wiring area; and patterning the dielectric material layer in the capacitor area to form the first interlayer dielectric.

According to one embodiment of the present disclosure, the step of forming the inter-electrode on the first interlayer dielectric includes: forming a metal layer on the first interlayer dielectric; reducing a thickness of the metal layer so as to form the plate and the at least one first finger of the inter-electrode; and forming the at least one second finger of the inter-electrode on the plate.

According to one embodiment of the present disclosure, the step of forming the second interlayer dielectric on the inter-electrode includes: forming a dielectric material layer on the first dielectric layer to cover the inter-electrode, wherein the dielectric material layer is spread over a wiring area and a capacitor area; completely removing the dielectric material layer in the wiring area; and patterning the dielectric material layer in the capacitor area to form the second interlayer dielectric.

According to one embodiment of the present disclosure, the step of forming the upper electrode on the second interlayer dielectric includes: forming a metal layer on the second interlayer dielectric; and reducing a thickness of the metal layer so as to form the upper electrode.

It is to be understood that both the foregoing general description and the following detailed description are by examples, and are intended to provide further explanation of the disclosure as claimed.

DETAILED DESCRIPTION

In the following detailed description, for purposes of explanation, numerous specific details are set forth in order to provide a thorough understanding of the disclosed embodiments. According to the description, claims and the drawings disclosed in the specification, one skilled in the art may easily understand the concepts and features of the present disclosure. The following embodiments further illustrate various aspects of the present disclosure, but are not meant to limit the scope of the present disclosure.

Figure 1:
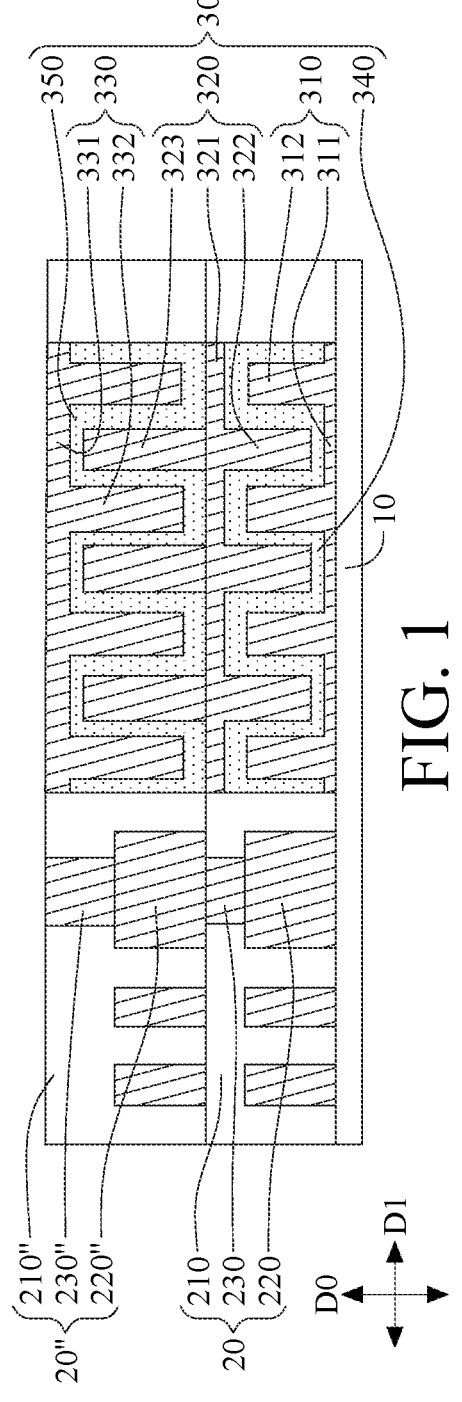
FIG. 1 is a schematic view of a circuit carrier according to an embodiment of the present disclosure.

FIG. 1 is a schematic view of a circuit carrier according to an embodiment of the present disclosure. In this embodiment, a circuit carrier 1A includes a core 10, a wiring layer 20, a wiring layer 20" and a capacitive element 30. The core 10 may be an electrically insulated substrate made of glass fiber and epoxy resin. FIG. 1 exemplarily depicts two wiring layers 20, 20" stacked in order, but the present disclosure is not limited by the number of the wiring layers.

The wiring layer 20 may include a first dielectric layer 210, a first wiring 220 and a first conductive blind hole 230. The wiring layer 20" may include a second dielectric layer 210", a second wiring 220" and a second conductive blind hole 230". Each of the first dielectric layer 210 and the second dielectric layer 210" may be a layer made of made of bakelite, glass fiber, epoxy resin, polyimide or a composite of organic polymer and filler.

The wiring layers 20, 20" is disclosed in this embodiment are merely exemplary. The present disclosure is not limited by the specific structure of the wiring layers 20, 20". In some other embodiments, the wiring layer may include a conductive via and an additional wiring layer connected thereto.

The capacitive element 30 is disposed in the first dielectric layer 210 and the second dielectric layer 210". The capacitive element 30 may be a buried capacitive element which includes a lower electrode 310, an inter-electrode 320 and an upper electrode 330. The inter-electrode 320 is located between the lower electrode 310 and the upper electrode 330. The lower electrode 310 may include a plate 311 and a plurality of fingers 312 connected with the plate 311, and the present disclosure is not limited by the number of the fingers 312.

The inter-electrode 320 includes a plate 321, a plurality of first fingers 322 and a plurality of second fingers 323, and the present disclosure is not limited by the number of the first fingers 322 as well as that of the second fingers 323. The first finger 322 and the second finger 323 extend from opposite sides of the plate 321, respectively. The fingers 312 of the lower electrode 310 extend toward the plate 321 of the inter-electrode 320.

The upper electrode 330 may include a plate 331 and a plurality of fingers 332 connected with the plate 331, and the present disclosure is not limited by the number of the fingers 332. The fingers 332 of the upper electrode 330 extend toward the plate 321 of the inter-electrode 320. Moreover, the first fingers 322 of the inter-electrode 320 extend from the plate 321 toward the plate 311 of the lower electrode 310, and the second fingers 323 extend from the plate 321 toward the plate 331 of the upper electrode 330.

In this embodiment, the fingers 312 of the lower electrode 310 are parallel with the first fingers 322 of the inter-electrode 320. In detail, in a length direction D1 of the circuit carrier 1A, the fingers 312 of the lower electrode 310 overlap the first fingers 322 of the inter-electrode 320. Moreover, the fingers 332 of the upper electrode 330 are parallel with the second fingers 323 of the inter-electrode 320. In detail, in the length direction D1 of the circuit carrier 1A, the fingers 332 of the upper electrode 330 overlap the second fingers 323 of the inter-electrode 320. The length direction D1 of the circuit carrier 1A is orthogonal to a lamination direction D0 in which the lower electrode 310, the inter-electrode 320 and the upper electrode 330 are sequentially provided.

In this embodiment, each of the lower electrode 310, the inter-electrode 320 and the upper electrode 330 may be a comb electrode. The fingers 312 of the lower electrode 310 and the first fingers 322 of the inter-electrode 320 are spaced at fixed intervals and arranged in a staggered manner to constitute interdigitated electrodes, such that the lower electrode 310 and the inter-electrode 320 can be equivalent to a parallel plate capacitor. The fingers 332 of the upper electrode 330 and the second fingers 323 of the inter-electrode 320 are spaced at fixed intervals and arranged in a staggered manner to constitute interdigitated electrodes, such that the upper electrode 330 and the inter-electrode 320 can be equivalent to another parallel plate capacitor. The two aforementioned parallel plate capacitors may be connected in parallel with each other to obtain higher equivalent capacitance.

In this embodiment, the first fingers 322 and the second fingers 323 of the inter-electrode 320 are disposed symmetrically with respect to the plate 321. In detail, in a thickness direction (that is, the lamination direction D0) of the circuit carrier 1A, first fingers 322 of the inter-electrode 320 completely overlap the second fingers 323 thereof.

In this embodiment, capacitive element 30 may further include a first interlayer dielectric 340 and a second interlayer dielectric 350. The first interlayer dielectric 340 is located between the lower electrode 310 and the inter-electrode 320, and the second interlayer dielectric 350 is located between the inter-electrode 320 and the upper electrode 330. The first interlayer dielectric 340 and the second interlayer dielectric 350 may be made of different material from the first dielectric layer 210 and the second dielectric layer 210″. For example, each of the first interlayer dielectric 340 and the second interlayer dielectric 350 may be made of epoxy-ceramic composite material with high dielectric constant to thereby increase capacitance.

Figure 2:
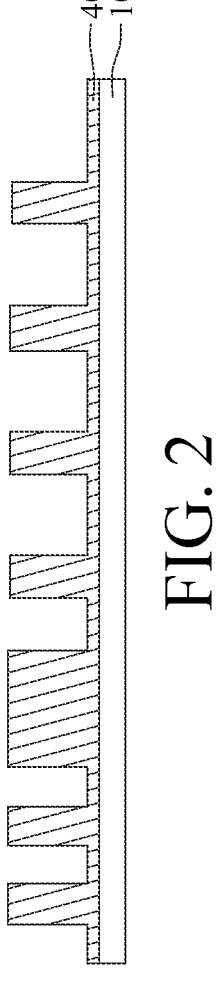
FIG. 2 through FIG. 5 are schematic views showing formation of a first wiring, a lower electrode and a first interlayer dielectric of the circuit carrier in FIG. 1.

An exemplary fabrication method of the circuit carrier 1A are described hereafter. FIG. 2 through FIG. 5 are schematic views showing formation of a first wiring, a lower electrode and a first interlayer dielectric of the circuit carrier in FIG. 1. As shown in FIG. 2, the core 10 is provided, and a metal layer 40 is formed on the core 10. Specifically, the metal layer 40 may be formed by lithography and plating, such that the metal layer 40 can be shaped to conform to the first wiring 220 and the lower electrode 310 which will be formed as shown in FIG. 5 in the subsequent step. Said plating may refer to chemical plating or electroplating.

Figure 3:
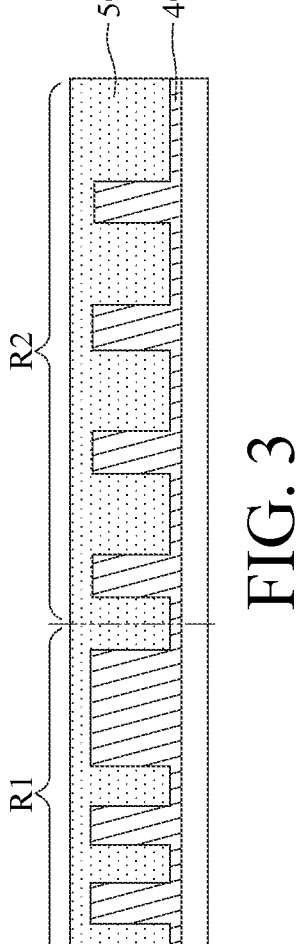
Figure 4:
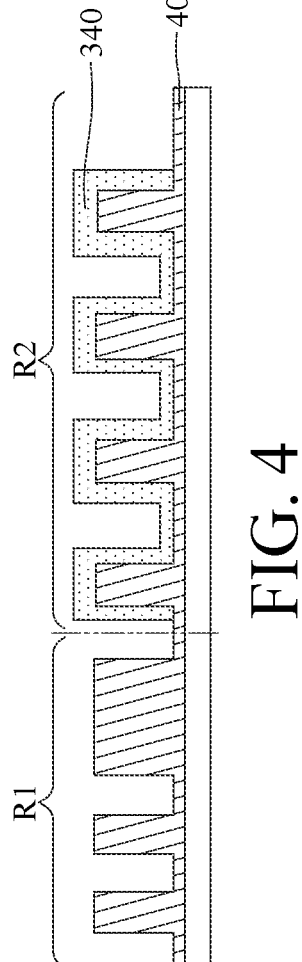
Figure 5:
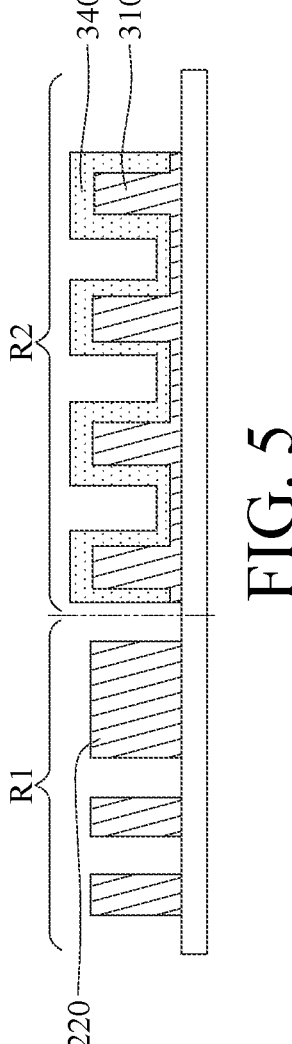

Next, as shown in FIG. 3 and FIG. 4, the first interlayer dielectric 340 is formed on the metal layer 40. In detail, the circuit carrier 1A can be defined to include a wiring area R1 and a capacitor area R2 which are non-overlapped, and the metal layer 40 is formed in the wiring area R1 and the capacitor area R2. Depending on the process requirements, the wiring layer 20 in FIG. 1 will be formed later in the wiring area R1, and the capacitive element 30 will be formed later in the capacitive area R2. A dielectric material layer 50 is formed on the metal layer 40 and spread over the wiring area R1 and the capacitor area R2. In the wiring area R1, the dielectric material layer 50 is completely removed to expose the metal layer 40 in the wiring area R1. In the capacitor area R2, the dielectric material layer 50 is patterned to form the first interlayer dielectric 340. The formation of the dielectric material layer 50 may be implemented by physical vapor deposition (PVD), ink-jet printing or vacuum lamination. The removal or patterning of the dielectric material layer 50 may be implemented by lithography and/or dry etching.

Next, as shown in FIG. 5, the metal layer 40 is partially removed to form the first wiring 220 and the lower electrode 310. The lower electrode 310 in the capacitor area R2 is located below the first interlayer dielectric 340. The removal of the metal layer 40 may be implemented by dry etching and/or wet etching.

Figure 6:
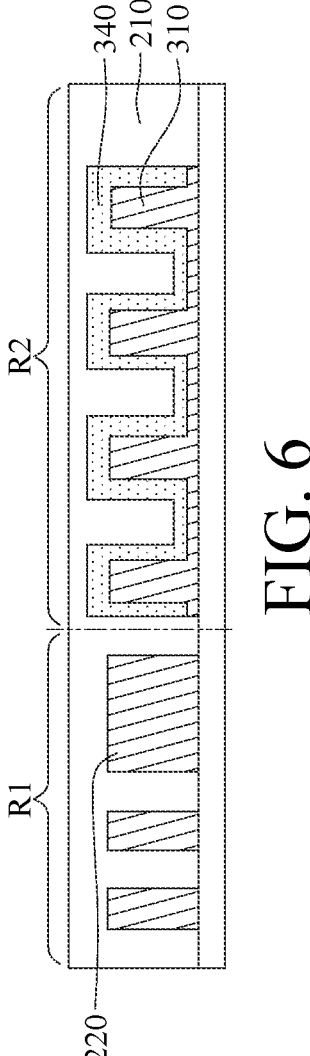
FIG. 6 and FIG. 7 are schematic views showing formation of a first dielectric layer of the circuit carrier in FIG. 1.
Figure 7:
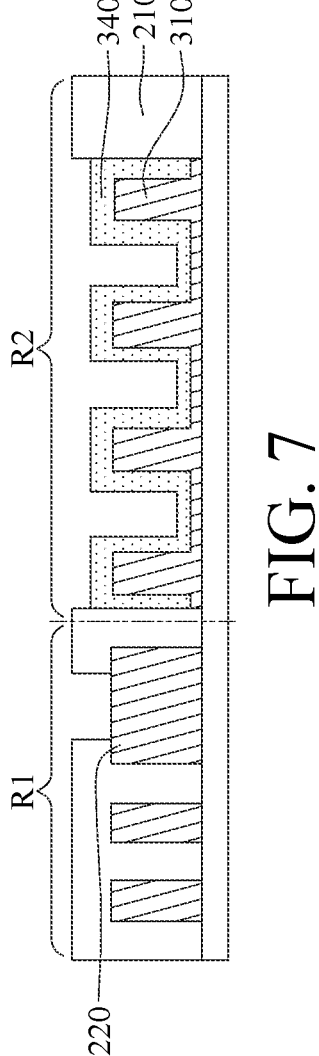

FIG. 6 and FIG. 7 are schematic views showing formation of a first dielectric layer of the circuit carrier in FIG. 1. The first dielectric layer 210 of the wiring layer 20 is formed on the core 10, and the first dielectric layer 210 exposes the first interlayer dielectric 340 and at least part of the first wiring 220. In detail, the first dielectric layer 210 is firstly formed on the core 10 to cover the first wiring 220, the lower electrode 310 and the first interlayer dielectric 340. In the wiring area R1, the first dielectric layer 210 is partially removed to expose part of a top surface of the first wiring 220. In the capacitive area R2, the first dielectric layer 210 is partially removed to expose entire top surface of the first interlayer dielectric 340. The formation of the first dielectric layer 210 may be implemented by PVD. The removal of the first dielectric layer 210 may be implemented by lithography and/or dry etching.

Figure 8:
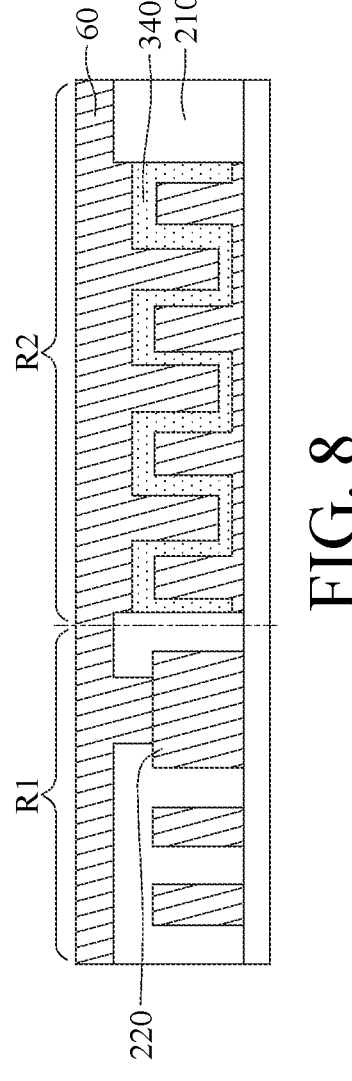
FIG. 8 through FIG. 10 are schematic views showing formation of a first conductive via, a second wiring and an inter-electrode of the circuit carrier in FIG. 1.
Figures 9, 10:
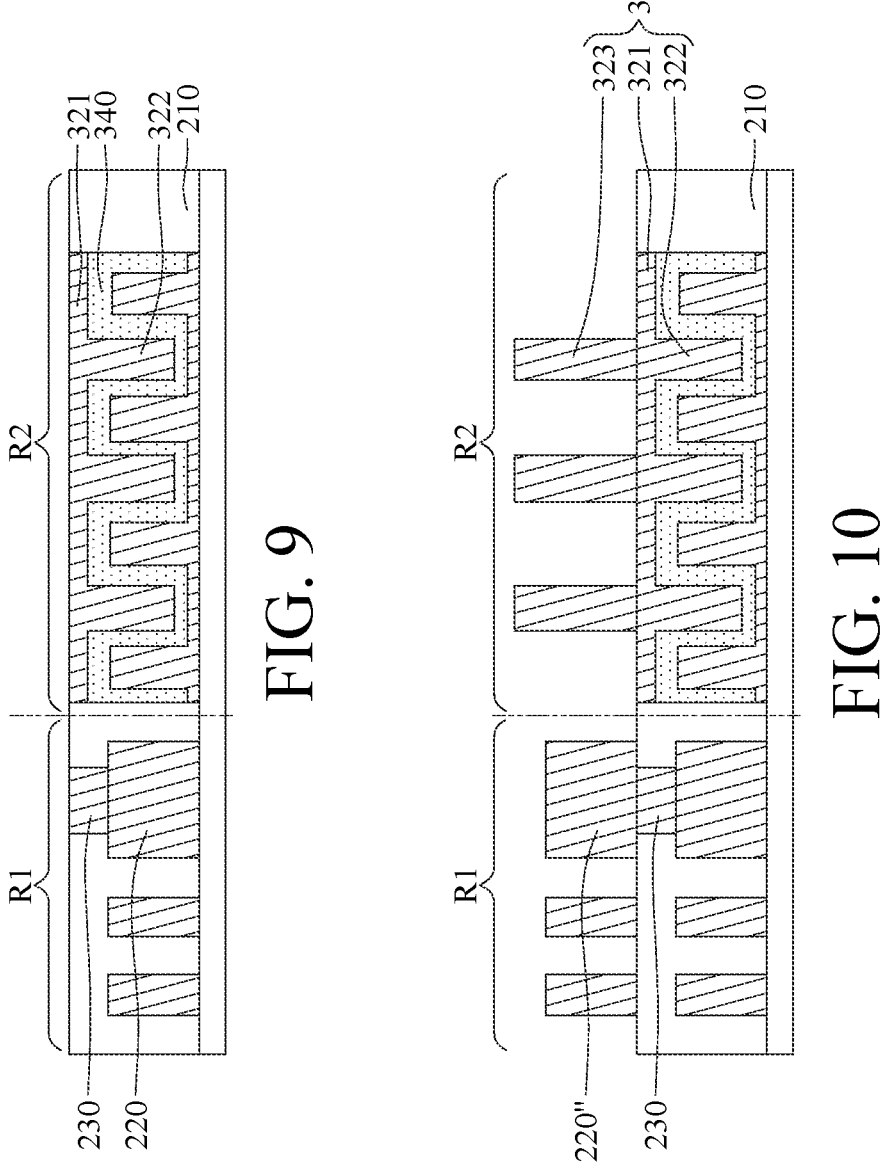

FIG. 8 through FIG. 10 are schematic views showing formation of a first conductive via, a second wiring and an inter-electrode of the circuit carrier in FIG. 1. As shown in FIG. 8, a metal layer 60 is formed on the first wiring 220, the first dielectric layer 210 and the first interlayer dielectric 340. The formation of the metal layer 60 may be implemented by chemical plating or electroplating.

Next, as shown in FIG. 9, a thickness of the metal layer 60 is reduced to form the first conductive blind hole 230 of the wiring layer 20 and the plate 321 as well the first fingers 322 of the inter-electrode 320. The first conductive blind hole 230 is connected with the first wiring 220. The reduction of thickness of the metal layer 60 may be implemented by chemical mechanical polishing (CMP).

Next, as shown in FIG. 10, in the wiring area R1, the second wiring 220″ is formed on the first conductive blind hole 230 and the first dielectric layer 210. In the capacitive area R2, the second fingers 323 of the inter-electrode 320 are formed on the plate 321. The second wiring 220″ and the second fingers 323 may be formed by lithography and plating. Said plating may refer to chemical plating or electroplating.

Figures 11, 12:
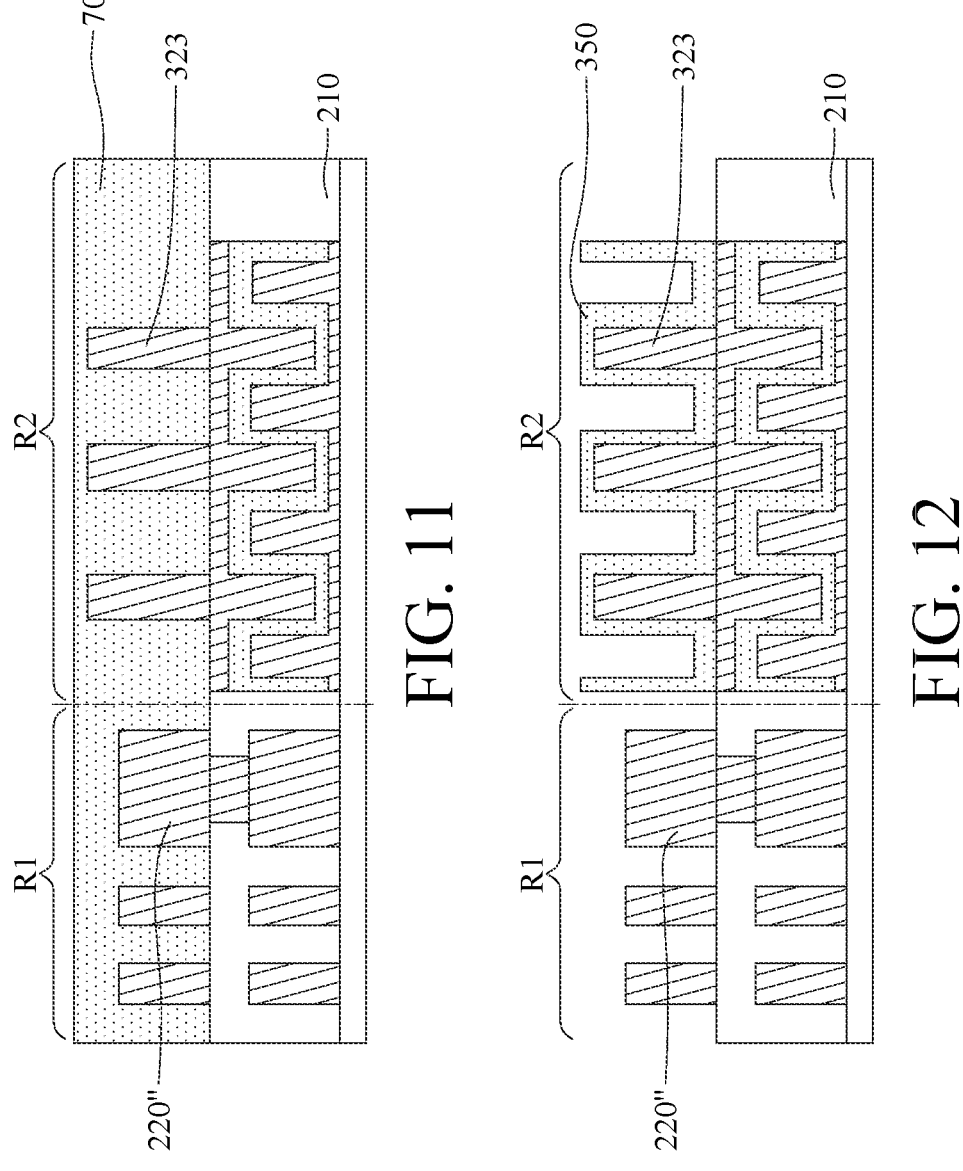
FIG. 11 and FIG. 12 are schematic views showing formation of a second interlayer dielectric of the circuit carrier in FIG. 1.

FIG. 11 and FIG. 12 are schematic views showing formation of a second interlayer dielectric of the circuit carrier in FIG. 1. A dielectric material layer 70 is formed on the first dielectric layer 210 and spread over the wiring area R1 and the capacitive area R2 to cover the second wiring 220″ and the inter-electrode 320. In the wiring area R1, the dielectric material layer 70 is completely removed to expose the entire of the second wiring 220″. In the capacitive area R2, the dielectric material layer 70 is patterned to from the second interlayer dielectric 350. The formation of the dielectric material layer 70 may be implemented by PVD, ink-jet printing or vacuum lamination). The removal or patterning of the dielectric material layer 70 may be implemented by lithography and/or dry etching.

Figures 13, 14:
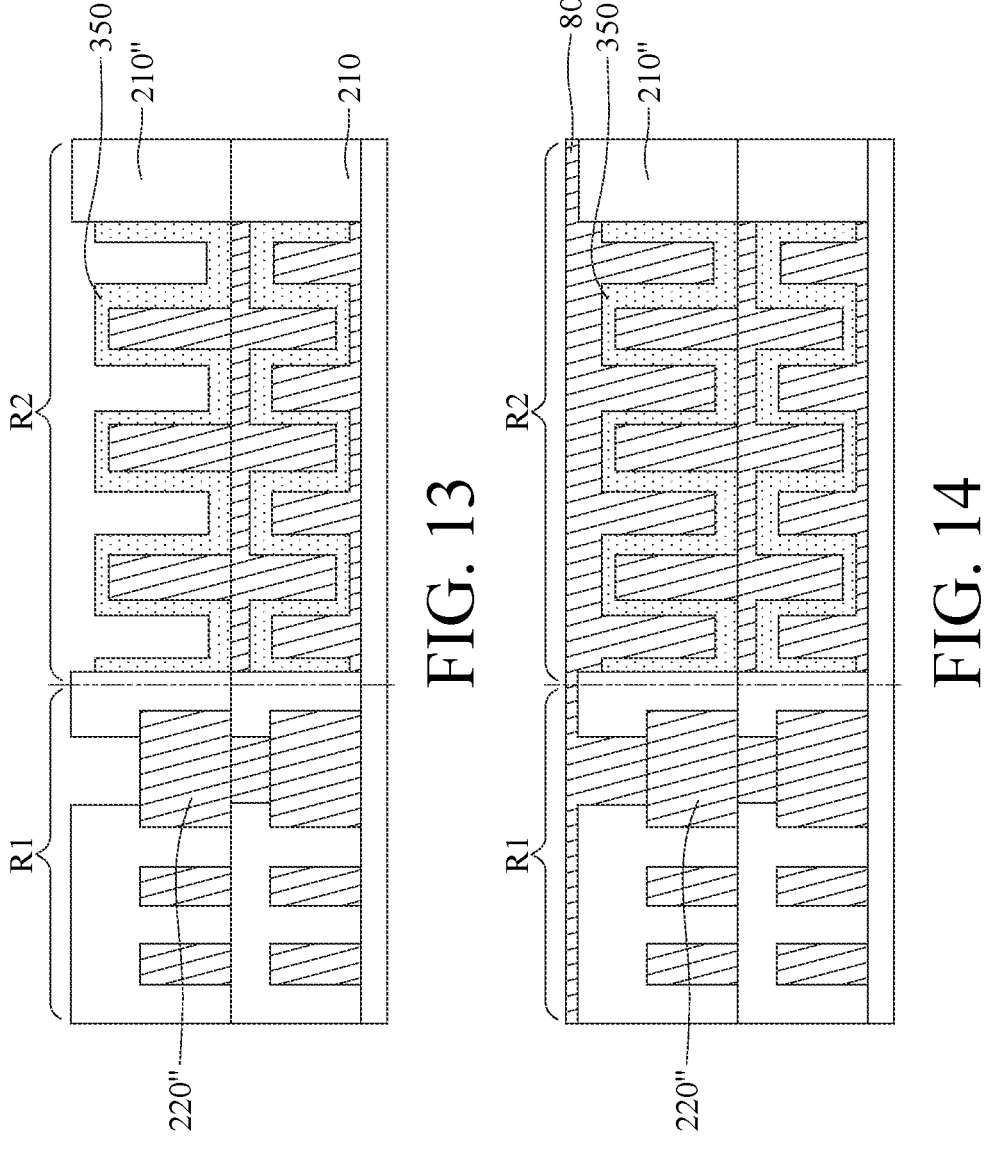
FIG. 13 is a schematic view showing formation of a second dielectric layer of the circuit carrier in FIG. 1.
FIG. 14 and FIG. 15 are schematic views showing formation of an upper electrode of the circuit carrier in FIG. 1.

FIG. 13 is a schematic view showing formation of a second dielectric layer of the circuit carrier in FIG. 1. The second dielectric layer 210″ of the wiring layer 20″ is formed on the first dielectric layer 210, and the second dielectric layer 210″ exposes the second interlayer dielectric 350 and at least part of the second wiring 220″. In detail, the second dielectric layer 210″ is firstly formed on the first dielectric layer 210 to cover the second wiring 220″ and the second interlayer dielectric 350. In the wiring area R1, the second dielectric layer 210″ is partially removed to expose part of a top surface of the second wiring 220″. In the capacitive area R2, the second dielectric layer 210″ is partially removed to expose the entire top surface of the second interlayer dielectric 350. The formation of the second dielectric layer 210″ may be implemented by PVD. The removal of the second dielectric layer 210″ may be implemented by lithography and/or dry etching.

Figures 15, 16:
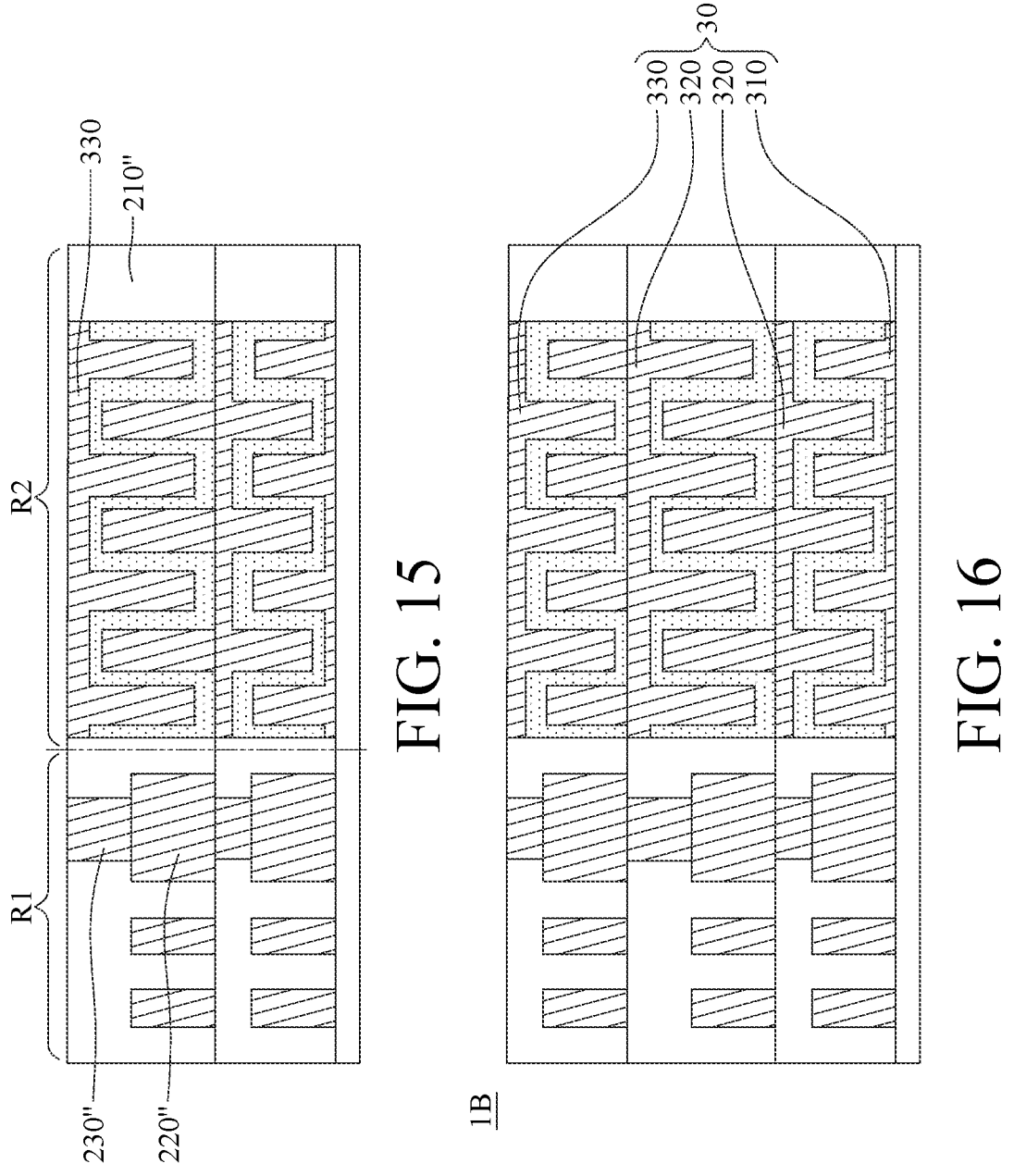
FIG. 16 is a schematic view of a circuit carrier according to another embodiment of the present disclosure.

FIG. 14 and FIG. 15 are schematic views showing formation of an upper electrode of the circuit carrier in FIG. 1. As shown in FIG. 14, a metal layer 80 is formed on the second wiring 220″, the second dielectric layer 210″ and the second interlayer dielectric 350. The formation of the metal layer 80 may be implemented by chemical plating or electroplating. As shown in FIG. 15, a thickness of the metal layer 80 is reduced to form the second conductive blind hole 230″ of the wiring layer 20″ and the upper electrode 330. The second conductive blind hole 230″ is connected with the second conductive blind hole 230″. The reduction of thickness of the metal layer 80 may be implemented by CMP. An additional signal transmission line (not shown in drawings) may be formed on the second conductive blind hole 230″.

The present disclosure is not limited to a three-layer structure of the electrodes. FIG. 16 is a schematic view of a circuit carrier according to another embodiment of the present disclosure. The circuit carrier 1B in this embodiment is similar to the circuit carrier 1A in FIG. 1. The primary difference between the circuit carriers 1A and 1B is that the circuit carrier 1B includes a capacitive element 30 which includes a plurality of inter-electrodes 320.

According to the present disclosure, the capacitive element includes a lower electrode, an inter-electrode and an upper electrode. The inter-electrode includes first finger extending from the plate toward the lower electrode, and second finger extending from the same toward the upper electrode. Therefore, the inter-electrode with comb structure is helpful to increase the capacitance between the inter-electrode and the lower electrode as well as that between the same and the upper electrode. Furthermore, the inter-electrode including electrode fingers allows small distance between the inter-electrode and the lower/upper electrode while still providing required capacitance, thus facilitating the thinning of the circuit carrier.

In some embodiments, the first fingers and the second fingers of the inter-electrode are disposed symmetrically with respect to the plate thereof, which is helpful to increase capacitance and reduce fabrication cost.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A circuit carrier, including:
at least one wiring layer; and
a capacitive element disposed in at least one dielectric layer of the at least one wiring layer;
wherein the capacitive element comprises a lower electrode, an inter-electrode and an upper electrode, the inter-electrode is located between the lower electrode and the upper electrode, the inter-electrode comprises a plate, at least one first finger and at least one second finger, and the at least one first finger and the at least one second finger extend from opposite sides of the plate, respectively;
wherein the capacitive element further comprises a first interlayer dielectric and a second interlayer dielectric, the first interlayer dielectric is located between the lower electrode and the inter-electrode, the second interlayer dielectric is located between the inter-electrode and the upper electrode.

2. The circuit carrier according to claim 1, wherein the lower electrode comprises a plate and at least one finger, the at least one finger of the lower electrode extends from the plate of the lower electrode toward the plate of the inter-electrode, and the at least one finger of the lower electrode is parallel with the at least one first finger of the inter-electrode.

3. The circuit carrier according to claim 2, wherein the at least one finger of the lower electrode overlaps the at least one first finger of the inter-electrode in a length direction of the circuit carrier.

4. The circuit carrier according to claim 1, wherein the upper electrode comprises a plate and at least one finger, the at least one finger of the upper electrode extends from the plate of the upper electrode toward the plate of the inter-electrode, and the at least one finger of the upper electrode is parallel with the at least one second finger of the inter-electrode.

5. The circuit carrier according to claim 4, wherein the at least one finger of the upper electrode overlaps the at least one second finger of the inter-electrode in a length direction of the circuit carrier.

6. The circuit carrier according to claim 1, wherein the at least one first finger and the at least one second finger of the inter-electrode are disposed symmetrically with respect to the plate of the inter-electrode.

7. The circuit carrier according to claim 1, wherein the at least one first finger of the inter-electrode completely overlaps the at least one second finger thereof in a thickness direction of the circuit carrier.

8. The circuit carrier according to claim 1, wherein the first interlayer dielectric and the second interlayer dielectric are made of different material from the at least one dielectric layer.

9. The circuit carrier according to claim 1, wherein each of the lower electrode, the inter-electrode and the upper electrode is a comb electrode.

10. A capacitive element for circuit carrier, comprising:
a lower electrode, an inter-electrode and an upper electrode, wherein the inter-electrode is located between the lower electrode and the upper electrode, the inter-electrode comprises a plate, at least one first finger and at least one second finger, and the at least one first finger and the at least one second finger extend from opposite sides of the plate, respectively;
wherein the at least one first finger and the at least one second finger are disposed symmetrically with respect to the plate of the inter-electrode; and
wherein the capacitive element further comprises a first interlayer dielectric and a second interlayer dielectric, the first interlayer dielectric is located between the lower electrode and the inter-electrode, the second interlayer dielectric is located between the inter-electrode and the upper electrode.

11. A fabrication method of a capacitive element for a circuit carrier, comprising:
forming a lower electrode and a first interlayer dielectric on a core, wherein the lower electrode is located below the first interlayer dielectric;
forming a first dielectric layer on the core, wherein the first dielectric layer exposes the first interlayer dielectric;
forming an inter-electrode on the first interlayer dielectric, wherein the inter-electrode comprises a plate, at least one first finger and at least one second finger, the at least one first finger and the at least one second finger extend from opposite sides of the plate, respectively;
forming a second interlayer dielectric on the inter-electrode;
forming a second dielectric layer on the first dielectric layer, wherein the second dielectric layer exposes the second interlayer dielectric; and
forming an upper electrode on the second interlayer dielectric.

12. The fabrication method according to claim 11, wherein the forming the lower electrode and the first interlayer dielectric on the core comprises:
forming a metal layer on the core;
forming the first interlayer dielectric on the metal layer; and
removing part of the metal layer to form the lower electrode.

13. The fabrication method according to claim 12, wherein the forming the metal layer on the core comprises processing the metal layer by lithography and plating.

14. The fabrication method according to claim 12, wherein the metal layer is formed on a wiring area and a capacitor area of the circuit carrier, and the forming the first interlayer dielectric on the metal layer comprises:

forming a dielectric material layer on the metal layer, wherein the dielectric material layer is spread over the wiring area and the capacitor area;

completely removing the dielectric material layer in the wiring area; and patterning the dielectric material layer in the capacitor area to form the first interlayer dielectric.

15. The fabrication method according to claim 11, wherein the forming the inter-electrode on the first interlayer dielectric comprises:

forming a metal layer on the first interlayer dielectric;

reducing a thickness of the metal layer so as to form the plate and the at least one first finger of the inter-electrode; and forming the at least one second finger of the inter-electrode on the plate.

16. The fabrication method according to claim 11, wherein the circuit carrier has a wiring area and a capacitor area, and the forming the second interlayer dielectric on the inter-electrode comprises:

forming a dielectric material layer on the first dielectric layer to cover the inter-electrode, wherein the dielectric material layer is spread over the wiring area and the capacitor area;

completely removing the dielectric material layer in the wiring area; and patterning the dielectric material layer in the capacitor area to form the second interlayer dielectric.

17. The fabrication method according to claim 11, wherein the forming the upper electrode on the second interlayer dielectric comprises:

forming a metal layer on the second interlayer dielectric; and reducing a thickness of the metal layer so as to form the upper electrode.

* * * * *